United States Patent [19]

Krohn

[11] Patent Number: 4,703,309
[45] Date of Patent: Oct. 27, 1987

[54] PRECISION OPTOELECTRONIC ROTATIONAL POSITION SENSOR

[75] Inventor: David A. Krohn, Hamden, Conn.

[73] Assignee: Eotec Corporation, West Haven, Conn.

[21] Appl. No.: 889,300

[22] Filed: Jul. 21, 1986

Related U.S. Application Data

[63] Continuation-in-part of Ser. No. 647,031, Sep. 4, 1984, Pat. No. 4,679,029.

[51] Int. Cl.$^4$ .................................................. G08C 9/06
[52] U.S. Cl. ............................ 340/347 P; 250/231 SE
[58] Field of Search ................. 250/231 SE, 578, 236; 340/347 P

[56] References Cited

U.S. PATENT DOCUMENTS

| | | | |
|---|---|---|---|
| 2,944,157 | 7/1960 | McAuslan et al. | 250/231 SE |
| 3,111,841 | 7/1969 | Gray | 250/231 SE |
| 3,187,187 | 6/1965 | Wingate | 250/231 SE |
| 3,381,288 | 4/1968 | Vlodrop | 250/231 SE |
| 3,509,349 | 4/1970 | Molines et al. | 250/578 |
| 3,525,856 | 8/1970 | Mengert et al. | 250/578 |
| 3,749,925 | 7/1973 | Hertrich | 250/231 SE |
| 3,912,926 | 10/1975 | Coulbourn | 250/231 SE |
| 4,524,347 | 6/1985 | Rogers | 340/347 P |
| 4,547,667 | 10/1985 | Sasaki et al. | 340/347 P |

Primary Examiner—Bernard Roskoski
Attorney, Agent, or Firm—Darby & Darby

[57] ABSTRACT

An apparatus for determining the rotational position of a shaft comprises opposed first and second disks mounted for relative rotation about a predefined axis, with one of the disks being mounted to the shaft for rotation therewith and the other of the disks being maintained in a reference position. First and second rows of spaced apertures are provided on each disk, which lie in concentric paths of different radial distance from the predefined axis, the first rows being at the same radial distance from the axis and second rows being at the same radial distance from the axis. These apertures are positioned so that apertures of the first rows move into alignment while apertures of the second rows move out of alignment as the disks are rotated relative to each other. A first beam of light of predetermined intensity is oriented so as to intersect the paths of the first rows of apertures, and a second beam of light of predetermined intensity is oriented so as to intersect the paths of the second rows of apertures. First and second photosensors are aligned respectively with the first and second beams of light, and the photosensors are positioned so that the disks are in front of the respective photosensor for each light beam. Each photosensor provides an electric output signal relative to the intensity of light sensed by it and the two output signals are differentially processed to provide an orientation signal representative of the relative rotational position of the disks.

12 Claims, 6 Drawing Figures

PRECISION OPTOELECTRONIC ROTATIONAL POSITION SENSOR

This is a continuation-in-part of application Ser. No. 647,031, filed Sept. 4, 1984, now U.S. Pat. No. 4,679,029.

The present invention relates generally to sensing rotational position of a shaft, or the like, by optoelectronic means and, more particularly, concerns an optoelectronic device which can provide measurement of small or large deviations in the rotational position of a shaft from a nominal orientation with equal high precision. Such devices find application, for example, in torque sensors.

BACKGROUND OF THE INVENTION

In U.S. Pat. No. 4,500,870, granted on Feb. 19, 1985, which is assigned to the assignee of the present patent application, there is disclosed an optoelectronic sensor for the angular or rotational position of a shaft. The sensor works in association with a light transmitter and a light receiver which are mounted in fixed positions. An element is mounted on the shaft for rotation therewith and includes a light reflecting track, a portion of which provides a light reflecting surface that completes the light transmission path between the transmitter and receiver. The track is constructed and positioned on the element so that, as the element rotates, the portion of the track within the light transmission path assumes a predefined sequence of positions, each of which is at a different distance from the transmitter and/or the receiver. Each different angular position of the shaft therefore establishes a light transmission path of a different length and produces a different level of light intensity at the receiver. By detecting the level of light intensity at the receiver, it is therefore possible to establish the rotational position of the shaft.

The angular position sensor of U.S. Pat. No. 4,500,870 was disclosed in association with sensing the position of a shaft in a utility meter. In this application, it was necessary to resolve ten angular ranges (corresponding to the digits "0" through "9") as the shaft rotated a full 360 degrees. In such an application, the angular position sensor of the patent application exhibited satisfactory linearity and resolution and therefore provided excellent performance.

However, there are some applications in which angular position of a shaft must be detected precisely over very small angles or rotation. For example, torque sensors may employ a shaft of known torsional characteristics which is anchored at one end and has the torque to be determined applied at the free end. The relative angular or rotational displacement between the two ends of the shaft is then measured to determine the value of the applied torque. This application requires detection of very small angular displacements with a high degree of precision and, therefore, linearity.

A number of problems are encountered when it is attempted to apply the angular position sensor of the above-identified patent in a device requiring precision determination of small angular displacement. First of all, it is found that small angular displacements produce changes in detected light intensity which are very small in comparison to the absolute intensity of light and are therefore difficult to detect accurately. In addition, although the slight non-linearity which may be present in the sensor does not affect accuracy significantly when relatively large angular displacements were involved, it represents a source of substantial error, when it is desirable to detect small changes in angular position.

In copending U.S. patent application Ser. No. 647,031 filed Sept. 4, 1984, which is assigned to the assignee of the present application, there is disclosed my concept for an apparatus for sensing rotational or angular position of a shaft. The apparatus incorporates two light transmission paths, each having a separate photodetector providing an electrical signal in response to received light, and these signals are differentially processed to obtain a signal representative of rotational position. Devices are provided in each of the light transmission paths to vary the light transmitted in the path, and these devices are mechanically coupled to the shaft so that the variations in the respective light paths are opposite. The differentially processed photodetector signals are unaffected by absolute position of the shaft, but are responsive only to deviations from a reference position, and the differentially processed signal exhibits a high degree of linearity that was previously unobtainable.

However, the embodiments of the invention disclosed in that patent application tended to rely on various mechanical means to achieve the opposite light transmission in the two paths and were, generally, not amenable to precise measurement of the position of the shaft that is rotated through a large displacement. Furthermore, it would be desirable to avoid dependence on mechanical means as much as possible, in order to optimize reliability and minimize maintenance requirements.

Broadly, it is an object of the present invention to provide an apparatus for detecting very small angular displacements of a shaft with a high degree of precision, while avoiding the shortcomings of the prior art.

It is another object of the present invention to provide a high precision optoelectronic rotational position sensor which achieves a high degree of linearity and high precision with very small angular displacements, yet can maintain the same precision, even with large angular displacements.

It is also an object of the present invention to provide an optoelectronic torque sensor which achieves a high degree of linearity and high precision.

It is further an object of the present invention to provide an angular position sensor which is simple and relatively inexpensive in construction, yet accurate, reliable and convenient in use.

In an illustrative embodiment demonstrating objects and features of the present invention, an apparatus for determining the rotational position of a shaft comprises opposed first and second disks mounted for relative rotation about a predefined axis, with one of the disks being mounted to the shaft for rotation therewith and the other of the disks being maintained in a reference position. First and second rows of spaced apertures are provided on each disk, which lie in concentric paths of different radial distance from the predefined axis, the first rows being at the same radial distance from the axis and second rows being at the same radial distance from the axis. These apertures are positioned so that apertures of the first rows move into alignment while apertures of the second rows move out of alignment as the disks are rotated relative to each other. A first beam of light of predetermined intensity is oriented so as to intersect the paths of the first rows of apertures, and a second beam of light of predetermined intensity is oriented so as to intersect the paths of the second rows of apertures. First and second photosensors are aligned respectively with the first and second beams of light, and the photosensors are positioned so that the disks are in front of the respective photosensor for each light beam. Each photosensor provides an electric output signal relative to the intensity of light sensed by it and the two output signals are differentially processed to provide an orientation signal representative of the relative rotational position of the disks.

BRIEF DESCRIPTION OF THE DRAWING

The foregoing brief description, as well as further objects, features and advantages of the present invention will be understood more completely from the following detailed description of a presently preferred, but nonetheless illustrative embodiment, with reference being had to the accompanying drawing, in which.

DETAILED DESCRIPTION

Figure 1:
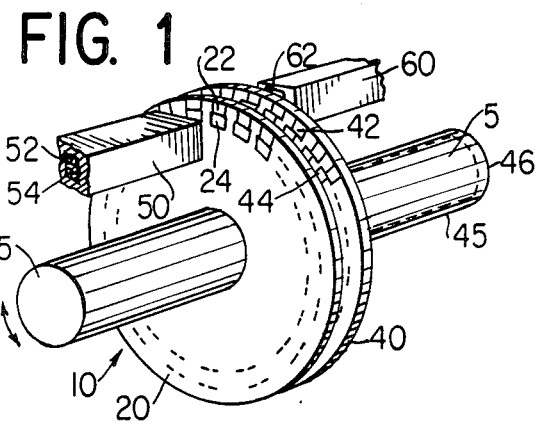
FIG. 1 is a perspective view of a precision optoelectronic rotational position sensor in accordance with the present invention.

Turning now to the details of the drawing, FIG. 1 illustrates a precision sensing apparatus 10 for the rotational or angular position of a shaft S. The apparatus 10 broadly comprises a disk member 20 mounted on the shaft S for rotation therewith; a disk member 40 mounted coaxially with respect to shaft 20 and in spaced, opposed relationship thereto, so as to permit free rotation of shaft S and disk 20 with respect to it; and scan heads 50 and 60 colinearly mounted in spaced, opposed relationships on opposite sides of the disks 20 and 40.

Disk members 20 and 40 may be made of metal or a sturdy plastic material. Each disk member has an inner and outer row of apertures in a generally circular arrangement. In each row, each of the apertures occupies a radially truncated 4° sector of a circle and is separated from an adjacent aperture by an opaque area, similarly occupying a 4° arc of a circle.

Disk member 20 is secured to shaft S for rotation therewith. The outer row of the disk 20 is made up of apertures 22, and the inner row is made up of apertures 24, which are in radial alignment with respect to the apertures 22.

Disk member 40 is mounted to a sleeve member 45, in which the shaft S is journaled for free rotation, and the remote end of 46 of shaft 45 is preferably anchored to prevent disk 40 from rotating. The outer row of disk 40, is made up of apertures 42, and the inner row, is made up of apertures 44, which are circumferentially offset by an angle of 4° with respect to the apertures 42.

Although the apertures 22, 24, 42 and 44 are illustrated as being rectangular in shape, it will be appreciated that they actually taper slightly toward the center of the respective disk, because they occupy a 4° circular arc. Also, although the above description makes reference to apertures and opaque areas therebetween, it will be appreciated that the apertures could actually be transparent areas on the disk. As used herein, the term "aperture" will therefore be understood to be an area of relatively high light transmissivity, whereas an "opaque" area will be understood to be an area of relatively low light transmissivity. The disks 20 and 40 could therefore conveniently made of a plastic material of relatively high light transmissivity, on which the inner and outer rows of apertures are conveniently created by coating the surface of the disk with a material of relatively low light transmissivity, in an appropriate pattern.

Scan head 50 includes upper and lower light transmission channels 52, 54, which have a cross-sectional shape corresponding to the shape of apertures 22 and 24, respectively. Similarly, scan head 60 has upper and lower channels 62, 64, the cross-sectional shape of which corresponds to that of channels 52 and 54, respectively. However, this conformity in shape is not indispensible to the invention, since it is only necessary that channels 52 and 54 be shaped and dimensional so that each provides illumination to only one aperture at a time and is capable of illuminating an entire aperture. Similarly, each of channels 62 and 64 must be large enough in cross section to receive all of the light transmitted through an aperture, but must not be so large that they can receive light from more than one aperture at a time. The channels 52, 54, 62 and 64 are filled with fiber optic bundles, which serve to connect scan head channels 52 and 54 to a light source of predetermined intensity, to connect channel 62 to a light sensor 72, and to connect channel 64 to a light sensor 74.

Figure 3:
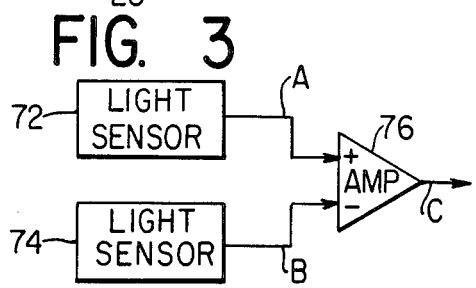
FIG. 3 is a schematic block diagram illustrating an arrangement for differentially processing the signals produced by the light sensors in the apparatus of FIG. 1.

Light sensors 72 and 74 are conventional photosensors which provide a voltage signal which is proportional to the intensity of light received thereby. As may be seen in FIG. 3, the voltage signals from light sensors 72 and 74, indicated by the reference characters A and B, respectively, are provided to the inputs of a differential amplifier 76, which produces a voltage signal C.

Figure 2:
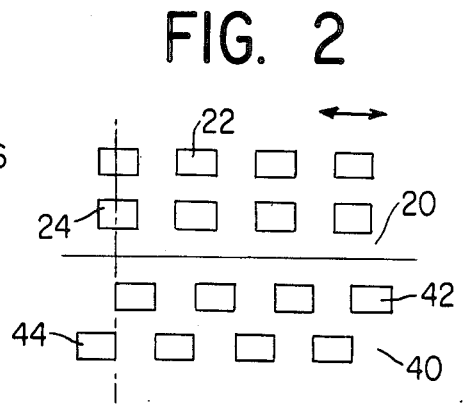
FIG. 2 is a schematic drawing, on an enlarged scale, illustrating the relationship of the apertures of the apparatus of FIG. 1 when the shaft is in a predefined reference position.

The operation of apparatus 10 is best understood by first considering the voltage signal C produced when shaft S is rotated through an angle of 4° about a reference position (−2° to 2°), as indicated by the double-headed arrow in FIGS. 1 and 2. FIG. 2 illustrates the relative position of disks 20 and 40 when shaft S is in its reference position of 0°. In this position, apertures 22 and 42 overlap by 2° and apertures 24 and 44 similarly overlap by 2°. Since non-overlapping portions of apertures are covered by opaque areas, only half an aperture is exposed to each of the channels 52 and 54 of scan head 50. Thus, only half of the light provided by channels 52 and 54 is transmitted to channels 62 and 64 for detection by the light sensors 72 and 74. The voltage waveforms A and B are therefore each at a level of 0.5, which corresponds to 50% of their maximum level (see 0° levels for waveforms A and B in FIG. 4)

Should shaft S be rotated clockwise (rightward movement of disk fragment 20 in FIG. 2), the overlap of apertures 22 and 42 increases, whereas that of apertures 24 and 44 decreases. This results in a linear increase of light transmission between channels 52 and 62, and there is corresponding decrease in light transmission between channels 54 and 64. When shaft S is rotated clockwise by 2°, apertures 22 and 42 are completely overlapped, whereas apertures 24 and 44 are completely covered by opaque areas. As a result, voltage waveform A achieves a level of 1 and voltage waveform B achieves a level of 0. Similarly, counterclockwise rotation of shaft S produces a linear decrease in waveform A and a linear increase in waveform B, until waveform A reach a level of 0 and waveform B a level of 1 when shaft S is rotated counterclockwise by 2° (i.e., a position of −2°). Inasmuch as waveform C is the difference between waveform A and waveform B, waveform C varies from a level of −1 when shaft S is at −2° to a level of 1 when shaft S is at 2°, and it assumes the level of 0 when shaft S is at 0°.

Figure 6:
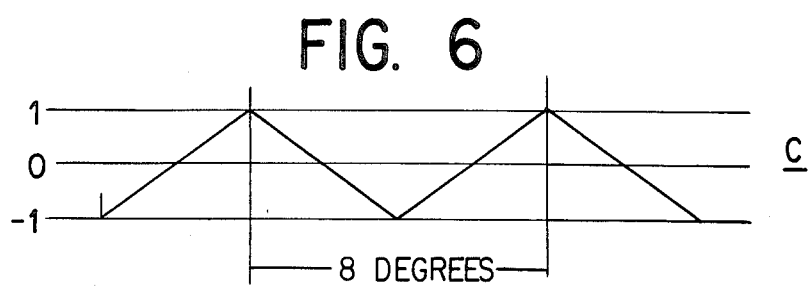
FIG. 6 is a waveform diagram illustrating the type of signal produced by the electronic illustrated in FIG. 3.

A similar analysis to the foregoing will reveal that waveform C decreases linearly from a level of 1 to a level −1 as shaft S is rotated from 2° to 6°, and that it varies linearly from a level of −1 to a level of 1 as shaft S is rotated from −2° to −6°. Hence, as shaft S is rotated, voltage signal C contains a repetitive triangular waveform, as illustrated in FIG. 6. The period of waveform C is 8°.

Figure 4:
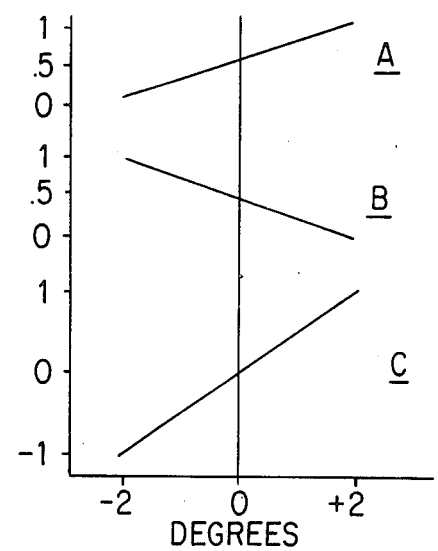
FIG. 4 is a waveform diagram useful in explaining the operation of the block diagram of FIG. 3.

When the apparatus 10 is utilized as a torque sensor, the remote end of shaft S is secured to the remote end 46 of sleeve 45. As mentioned above, the remote end 46 is anchored against rotation, so that the remote end of shaft S is also then anchored against rotation. The application of a torque to the near end of shaft S therefore causes the shaft to twist axially, whereby the disk 20 is rotated with respect to the disk 40. If shaft S has a predetermined torsional characteristic and disk 20 is disposed at a predetermined distance from remote end 46, the angular displacement of disk 20 with respect to disk 40 (and therefore the magnitude of waveform C) will bear a relationship to the applied torque. Hence, the portion of waveform C illustrated in FIG. 4 is useful in providing an indication of the direction and magnitude of this torque.

Apparatus 10 can readily resolve the angular displacement of shaft S to within 0.04°, which is excellent for a torque sensor. However, as will be explained more fully below, when apparatus 10 is utilized as a rotational position sensor, it maintains the same resolution regardless of the actual angular displacement of shaft S, so that the same high precision is available, even for large angular displacements of the shaft.

When apparatus 10 is operated as an angular displacement sensor for shaft S, the shaft is permitted to rotate freely within sleeve 45. As explained above, voltage signal C then assumes the form of a series of triangular waveforms, as illustrated in FIG. 6.

Figure 5:
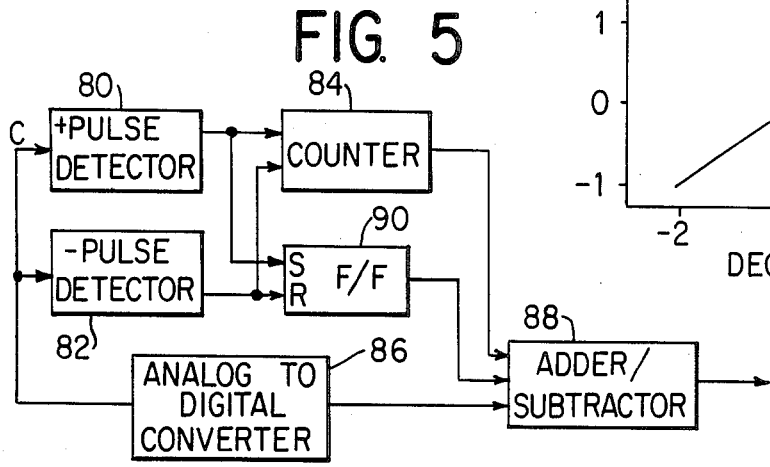
FIG. 5 is a schematic block diagram illustrating the electronics useful with the apparatus of FIG. 1 for determining with high precision, the rotational position of a shaft rotated through a large angular displacement.

FIG. 5 illustrates a schematic block diagram for electronic circuitry which is useful in converting the waveform C to a digital signal representing total angular displacement of shaft S. Waveform C is applied to a positive pulse detector 80 and a negative pulse detector 82. These pulse detectors produce a pulse in response to the attainment by waveform C of the maximum positive and negative levels, respectively. These pulses are applied to a counter 84, which increments its count upon every occurrence of a pulse. Counter 84 therefore contains a count which correspond to the number of 4° half cycles in waveform C, or the number of 4° increments through which shaft S has been rotated. Waveform C is also applied to an analog-two digital converter 86, which converts the instantaneous amplitude of the waveform to a digital number representative of the number of degrees corresponding to that amplitude in waveform C and therefore the amount of rotation of shaft S since the last pulse. The outputs of counter 84 and analog-to-digital converter 86 are then combined in an adder/subtracter 88, to provide a digital signal representing the total angular displacement of shaft S. In this latter digital signal, counter 84 contributes a "coarse" component of displacement, whereas analog-to-digital converter 86 contributes a fine component of displacement.

Adder/subtracter 88 is a conventional digital component, which is controlled by means of an input (indicated by the "-" symbol in FIG. 5) to either add the two other inputs applied to it, or to subtract the lower input from the upper input. The function of adder/subtracter 88 is controlled by means of the output of a flip-flop 90 with subtraction taking place when the output of the flip-flop goes high, and addition taking place when the output of the flip-flop goes low.

Flip-flop 90 is a conventional set-reset flip-flop, which is characterized by its output going high when a pulse is applied to its S input, and its output going low when a pulse is applied to its R input. The S and R inputs to flip-flop 90 are provided from the positive pulse detector 80 and negative pulse detector 82, respectively. Hence, the circuitry of FIG. 5 will subtract the output of analog-to-digital converter 86 from the output of counter 84 after the occurrence of a positive pulse, and it will add these two outputs after the occurrence of a negative pulse. This is equivalent to inverting the negative going portions of waveform C, so that the contribution of the analog-to-digital converter always has a consistent value related to the "fine" angular displacement within a 4°. half cycle.

From the foregoing description, it will be appreciated that the output of adder/subtracter 82 will have the same high precision resolution, regardless of the actual angular displacement of shaft S.

Although a preferred embodiment of the invention has been disclosed for illustrative purposes, those skilled in the art will appreciate that many additions, modifications and substitutions are possible, without departing from the scope and spirit of the invention as defined in the accompanying claims.

What is claimed is:

1. An apparatus for determining the rotational position of a shaft comprising:

opposed first and second substantially flat members mounted for relative rotation about a predefined axis, one of said members being mounted to said shaft for rotation therewith, the other of said members being maintained in a reference position;

first and second generally circular arrays of spaced apertures on each of said members, the first and second arrays lying in concentric paths of different radial distance from said axis, the first arrays being at the same radial distance from said axis on different ones of said members and the second arrays being at the same radial distance from said axis on different ones of said members, said apertures being positioned so that apertures of said first arrays move into overlapping alignment while apertures of said second arrays move out of overlapping alignment as said first member is rotated relative to said second member;

means for providing a first beam of light of predetermined intensity, the beam of light being oriented so as to intersect the paths of said first rows of apertures;

means for providing a second beam of light of predetermined intensity, the beam of light being oriented so as to intersect the paths of said second rows of apertures;

first and second photosensors coupled to be aligned, respectively, with said first and second beams of light, each photosensor being positioned so that said first and second members are intermediate each light providing means and the respective photosensor, each photosensor providing an electrical output signal related to the intensity of light sensed thereby; and means differentially responsive to the output signals of said first and second photosensors for providing an orientation signal related to the difference in the intensity of light sensed by said first and second photosensors, said orientation signals being representative of the relative rotational position of said first and second members over a range comparable to the angular extent of one of said apertures.

2. An apparatus in accordance with claim 1 wherein said first and second substantially flat members are generally disk-shaped and concentric with said axis, said first and second arrays of apertures being concentric with said axis.

3. Apparatus in accordance with claim 1 wherein said apertures comprise an opening formed within the respective member.

4. An apparatus in accordance with claim 1 wherein said apertures comprise an area of relatively high light transmissivity formed in the respective member, the area between adjacent apertures being of relatively low light transmissivity.

5. Apparatus in accordance with claim 1 wherein each of said apertures occupies a 4° arc of a circle and the area between adjacent apertures has a relatively low light transmissivity and also occupies a 4° arc of a circle.

6. Apparatus in accordance with claim 1 wherein the apertures in the first and second arrays of one of said members are in radial alignment and the apertures in the first and second arrays of the other member are relatively offset so that each aperture of the first array lies circumferentially intermediate two apertures of the second array.

7. Apparatus in accordance with claim 6 further comprising a first scan head having upper and lower channels respectively defining said means for providing a first beam and said means for providing a second beam, said upper and lower channels being adapted to be coupled to a source of light and being dimensioned and positioned to communicate respectively with apertures in said first and second arrays.

8. Apparatus in accordance with claim 7 further comprising a second scan head having upper and lower light transmitting channels coupled respectively to said first and second photosensors, said upper and lower channels being positioned and dimensioned to communicate, respectively, with the apertures of said first and second arrays.

9. Apparatus in accordance with claim 1 further comprising a first scan head having upper and lower channels respectively defining said means for providing a first beam and said means for providing a second beam, said upper and lower channels being adapted to be coupled to a source of light and being dimensioned and positioned to communicate respectively with apertures in said first and second arrays.

10. Apparatus in accordance with claim 9 further comprising a second scan head having upper and lower light transmitting channels coupled respectively to said first and second photosensors, said upper and lower channels being positioned and dimensioned to communicate, respectively, with the apertures of said first and second arrays.

11. Apparatus in accordance with claim 1 further comprising a second scan head having upper and lower light transmitting channels coupled respectively to said first and second photosensors, said upper and lower channels being positioned and dimensioned to communicate, respectively, with the apertures of said first and second arrays.

12. Apparatus in accordance with claim 1, further comprising means for counting the number of cycles occurring in said orientation signal, and means for forming a weighted combination of said orientation signal and the count of said counting means, the weight combination being representative of the cumulative rotational position of said shaft.

* * * * *